US006737926B2

(12) United States Patent
Forbes

(10) Patent No.: US 6,737,926 B2
(45) Date of Patent: May 18, 2004

(54) METHOD AND APPARATUS FOR PROVIDING CLOCK SIGNALS AT DIFFERENT LOCATIONS WITH MINIMAL CLOCK SKEW

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,237

(22) Filed: Aug. 30, 2001

(65) Prior Publication Data

US 2003/0052723 A1 Mar. 20, 2003

(51) Int. Cl.$^7$ .............................................. H03B 27/00
(52) U.S. Cl. ........................................ 331/57; 331/45
(58) Field of Search ............................ 331/45, 1 R, 10, 331/8, 50, 57, 60; 327/231, 233, 237, 256, 291–295

(56) References Cited

U.S. PATENT DOCUMENTS

| 4,891,609 | A | * | 1/1990 | Eilley .......................... 331/57 |
|---|---|---|---|---|
| 5,206,609 | A | * | 4/1993 | Mijuskovic ................... 331/57 |
| 5,298,870 | A | * | 3/1994 | Cytera et al. ................. 331/45 |
| 5,307,381 | A | | 4/1994 | Ahuja ......................... 375/107 |
| 5,398,262 | A | | 3/1995 | Ahuja ......................... 375/356 |
| 5,561,692 | A | * | 10/1996 | Maitland et al. ............. 375/371 |
| 5,777,520 | A | * | 7/1998 | Kawakami ................... 331/1 R |
| 5,793,246 | A | * | 8/1998 | Vest et al. ................... 327/536 |
| 5,811,983 | A | * | 9/1998 | Lundberg .................... 324/763 |
| 5,942,947 | A | | 8/1999 | Bhagwan ....................... 331/8 |
| 6,081,165 | A | * | 6/2000 | Goldman ..................... 331/57 |
| 6,271,730 | B1 | * | 8/2001 | Abe et al. ..................... 331/34 |
| 6,310,505 | B1 | * | 10/2001 | Ogawa et al. ............... 327/276 |
| 6,310,523 | B1 | * | 10/2001 | Chen et al. .................... 331/57 |
| 6,310,928 | B1 | * | 10/2001 | Yunome ...................... 375/376 |
| 6,369,624 | B1 | * | 4/2002 | Wang et al. ................. 327/156 |
| 6,380,787 | B1 | * | 4/2002 | Forbes ........................ 327/292 |
| 6,388,492 | B2 | * | 5/2002 | Miura et al. ................. 327/291 |
| 6,396,358 | B1 | * | 5/2002 | Poss et al. ..................... 331/57 |
| 2002/0113660 | A1 | * | 8/2002 | Dally et al. ................. 331/135 |

OTHER PUBLICATIONS

K. Yip, "Clock tree distribution: balance is essential for a deep–submicron ASIC design to flourish," *IEEE Potentials*, vol. 16, No. 2, pp. 11–14, Apr.–May 1997.
K. M. Carrig et al., "Clock methodology for high–performace microprocessors," *Proc. Custom Integrated Circuits Conference*, Santa Clara, CA, May 5–8, pp. 119–122, 1997.
J. L. Neves et al., "Automated synthesis of skew–based clock distribution networks," VLSI Design, vol. 7, No. 1, pp. 31–57, 1998.

(List continued on next page.)

*Primary Examiner*—Terry D. Cunningham
*Assistant Examiner*—Quan Tra
(74) *Attorney, Agent, or Firm*—TraskBritt

(57) ABSTRACT

A tapped phase shift ring oscillator may be used to provide multiple clock signals having variable phase delays. Phase delays may be selected to compensate for clock skews at different locations on high speed chips, or to provide clock signals having specific, desirable phase relationships, such as quadrature signals. The phase shift ring oscillator includes an odd number of amplifier stages. Each amplifier stage includes a phase shift network and an amplifier network. CMOS components used in the phase shift and amplifier networks provide voltage controlled variable phase shift and low gain, wide bandwidth, and low output impedance.

23 Claims, 4 Drawing Sheets

OTHER PUBLICATIONS

K. Ishibashi et al., "A Novel clock distribution system of CMOS VLSI," Proc. *IEEE Int. Conf. on Computer Design: VLSI in Computers and Processors*, Oct. 3–6, Cambridge, MA, pp. 289–292, 1993.

T. Knight et al., "A Method for skew–free distribution of digital signals using matched variable delay lines," *Symp. on VLSI Circuits*, Kyoto, Japan. May 19–21, pp. 19–20, 1993.

S. I. Liu et al., "Low–power clock–deskew buffer for high speed digital circuits," *IEEE J. Solid–State Circuits*, vol. 34, No. 4, pp. 554–558, 1999.

H. South et al., "A Clock Distribution Technique with an Automatic Skew Compensation Circuit," *IEICE (Inst. of Electronic, Information and Communication Engineers, Japan)*, vol. E8 I–C, No. 2, pp. 277–283, 1998.

A. V. Mule et al., "10 GHz Hybrid optical/electrical clock distribution network for gigascale integration,"*Proceedings of the 1999 12th Annual Meeting IEEE Lasers and Electro–Optics* Society (LEOS'99), Francisco, CA, Nov. 1999, vol. 2, pp. 627–623.

* cited by examiner

"H" - TREE

GRID

BALANCED TREE

BALANCED TREE WITH BUFFERS

METHOD AND APPARATUS FOR PROVIDING CLOCK SIGNALS AT DIFFERENT LOCATIONS WITH MINIMAL CLOCK SKEW

RELATED APPLICATION

This application is related to co-pending applications: Ser. No. 09/385,383 filed Aug. 30, 1999, now U.S. Pat. 6,552,564, issued Apr. 22, 2003, Ser. No. 09/386,505 filed Aug. 31, 1999, now U.S. Pat. No. 6,380,787, issued Apr. 30, 2002, Ser. No. 09/385,379 filed Aug. 30, 1999, now U.S. Pat. No. 6,539,490, issued Mar. 25, 2003, and Ser. No. 09/860,131 filed May 17, 2001, now U.S. Pat. 6,535,071, issued Mar. 18, 2003.

BACKGROUND OF THE INVENTION

1. Field of the Invention

The present invention relates generally to clock signals in integrated circuits. Specifically, the present invention relates to reduction of clock skew in clock signals provided to multiple locations in the integrated circuit.

2. State of the Art

Digital integrated circuits typically include multiple logic elements, with the timing of operation of each logic element controlled by a clock signal. It is common for an integrated circuit chip to have one central clock generator, with the signal from the clock generator being distributed around the integrated circuit via clock-line interconnects. An important consideration in the design of synchronous digital integrated circuits, and in particular those using pipelined architecture, is variation in the arrival times of clock signals at the clock inputs of the various logic elements. See, K. Yip, "Clock tree distribution: balance is essential for a deep-submicron ASIC design to flourish," IEEE Potentials, vol. 16, no. 2, pp. 11–14, April–May 1997. Variation in clock signal arrival time is referred to as clock skew.

Clock skew is primarily a function of two parameters: the loading presented by the logic being clocked and the RC delay of the clock line interconnect. Interconnect factors that affect the clock skew are the resistance, capacitance and inductance of the interconnection wires. Since the wires are not ideal conductors, different lengths of the wires carrying clock signals can result in different clock skews. Clock skew adds to cycle times, reducing the clock rate at which a chip can operate. Typically, skew should be 10 percent or less of a chip's clock cycle, meaning that for a 100 MHz clock, skew must be 1 nsec or less. High performance microprocessors may require skew to be 5 percent of the clock cycle, or 100 psec at a 500 MHz clock rate. See, K. M. Carrig et al., "Clock methodology for high-performance microprocessors," Proc. Custom Integrated Circuits Conference, Santa Clara, Calif., May 5–8, pp. 119–122, 1997.

As noted above, it is relatively common to use a single, central clock generator to produce a signal that is distributed around the integrated circuit. A variety of techniques have been used in the prior art to provide clock connections that are symmetrical and all of the same length, in order to minimize clock skew at the various logic elements.

FIG. 1A illustrates an H-tree clock distribution, which is used primarily in custom layouts and has varying tree interconnect segment widths to balance skew throughout the chip.

FIG. 1B shows a clock grid clock distribution structure. The clock grid is the simplest clock distribution structure and has the advantage of being easy to design for low skew. However, it is area inefficient and power hungry because of the large amount of clock interconnect required. Nevertheless, some chip vendors are using this clock structure for microprocessors.

FIG. 1C depicts a balanced tree clock distribution structure. The balanced tree is the clock distribution structure most commonly used in high performance chips. See, J. L. Neves et al., "Automated synthesis of skew-based clock distribution networks," VLSI Design, vol. 7, no. 1, pp. 31–57, 1998. In order to carry current to the branching segments, the clock line is widest at the root of the tree and becomes progressively narrower at each branch. As a result, the clock line capacitance increases exponentially with distance from the leaf cell (clocked element) in the direction of the root of the tree (clock input). Moreover, additional chip area is required to accommodate the extra clock line width in the regions closer to the root of the tree.

As shown in FIG. 1D, buffers may be added at the branching points of the balanced tree structure. Adding buffers at the branching points of the tree significantly lowers clock interconnect capacitance, because it reduces the clock line width required toward the root.

As noted above, two main factors that contribute to clock skew are loading mismatch at the clocked elements and mismatch in RC delay due to clock line segment width and length variations. The approaches discussed above and illustrated in FIGS. 1A–1D attempt to minimize clock skew caused by these factors. Most designers and clock tree parasitic extraction/evaluation tools available today deal only with RC parasitics. However, clock skew is also influenced by inductance effects, which become more prominent as clock edge times and interconnect resistances decrease, both of which are associated with shrinking chip technology and higher clock rates. For these reasons, minimization of skew due to inductance effects has become the biggest problem in the design of clock trees, and, similarly, has become a significant problem in the design of today's leading edge chips.

Designers have not commonly considered parasitic inductance, but this is starting to change as clock frequencies approach 1 GHz. Clock trees often have wide traces at their roots and may also have long segments, making the trees more susceptible to inductance problems than are other chip networks. Careful layout, including placing power and ground lines next to, above, or below clock trees to act as shields, can help reduce the possibility of clock problems caused by inductance.

Clock skew may also be influenced by process variations induced during chip fabrication.

Various techniques have been previously described for compensating for the different delays of individual clock distribution lines by changing the line characteristics or driver characteristics. Many new techniques have been considered for addressing clock skew problems. One technique involves the generation of clock signals with various delays by using digital inverters or amplifiers with various signal delays, and multitapped variable delay lines. See, K. Ishibashi et al., "Novel clock distribution system for CMOS VLSI," Proc. IEEE Int. Conference on Computer Design: VLSI in Computers and Processors, October 3–6, Cambridge, Mass., pp. 289–292, 1993. Another technique involves the use of buffer amplifiers with different skews to compensate for the different line delays. See, T. Knight et al., "Method for skew-free distribution of digital signals using matched variable delay lines," Symposium on VLSI Circuits, Kyoto, Japan, May 19–21, pp. 19–20, 1993; see also S. I. Liu et al., "Low-power clock-deskew buffer for high speed digital circuits," IEEE J. Solid-State Circuits, Vol. 34, No. 4, pp. 554–558, 1999. Clock skew problems have also been addressed using feedback techniques to compensate for the effects of the variable line delays. See, H. Sutoh et al, "A Clock Distribution Technique with an Automatic Skew Compensation Circuit," Inst. of Electronic, Information and Communication Engineers, Japan, Vol. E8 1-C, No. 2, pp. 277–283, 1998. Furthermore, optical clock distribution techniques are also used. See, A. V. Mule et al., "10 GHz Hybrid optical/electrical clock distribution network for gigascale integration," Proceeding of the 1999 $12^{th}$ Annual Meeting IEEE Lasers and Electro-Optics Society, San Francisco, Calif., November 1999, vol. 2, pp. 627–628. It has previously been proposed by the inventor to minimize clock skew by using low-impedance lines with matched terminations and current mode signaling to give well-defined delays along clock distribution lines (U.S. patent application Ser. No. 09/385,383 and U.S. patent application Ser. No. 09/386,505) and using lines with zero or no apparent delay of the clock signal (U.S. patent application Ser. No. 09/385,379).

However, there remains a need for solving the problems caused by clock skew at multiple locations in integrated circuits, and, in particular, there is a need for reducing clock skew to acceptable levels in high performance microprocessors and other high speed chips in which small clock edge times and low interconnect resistances cause inductance effects. There is also a need for a method for distributing clock signals without skew and without consuming large amounts of power or chip space.

BRIEF SUMMARY OF THE INVENTION

The present invention comprises a tapped phase shift ring oscillator which may be used to generate a plurality of clock signals having different phase relationships. The phase shift ring oscillator includes an odd number of amplifier stages. A clock signal may be tapped from the output of each amplifier stage. Each amplifier stage includes a phase shift network and an amplifier network. The phase shift network of each amplifier stage includes an RC network made up of a capacitor and an NMOS transistor configured as a voltage variable resistor to provide an adjustable phase shift. The amplifier network of each amplifier stage includes an NMOS transistor and diode-connected PMOS transistor. By utilizing CMOS elements, each amplifier stage has a low gain, wide bandwidth, and low output impedance. A total phase shift of 180 degrees around the loop, a necessary condition for oscillation, may then be obtained with a large number of stages, each producing a small phase shift. The phase delay at each amplifier stage may be adjusted as desired, providing the total phase shift for the loop is 180 degrees. The phase shift ring oscillator is thus well suited for generating multiple high frequency clock signals having small phase delays or skews adjusted to compensate for delays caused by differences in clock distribution lines, and thus for providing synchronous signals at clocked logic elements.

The present invention provides a number of advantages. For example, the present invention may be used to provide multiple clock signals for timing multiple logic elements on high speed chips. The present invention also provides a method for distributing clock signals which have low power consumption. The present invention farther provides a method for distributing clock signals with minimal clock skew and which does not require a large amount of chip space. The present invention may be used to provide multiple clock signals having delays which can be readily varied, or having specific selected phase relationships.

BRIEF DESCRIPTION OF THE SEVERAL VIEWS OF THE DRAWINGS

While the specification concludes with claims particularly pointing out and distinctly claiming that which is regarded as the present invention, this invention can be more readily ascertained from the following description of the invention when read in conjunction with the accompanying drawings in which:

DETAILED DESCRIPTION OF THE INVENTION

Figure 1A:
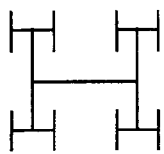
FIG. 1A is a prior art H-tree clock distribution structure.
Figure 1B:
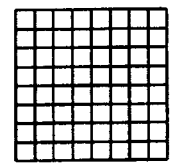
FIG. 1B is a prior art clock grid clock distribution structure.
Figure 1C:
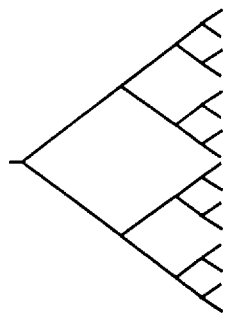
FIG. 1C is a prior art balanced tree clock distribution structure.
Figure 1D:
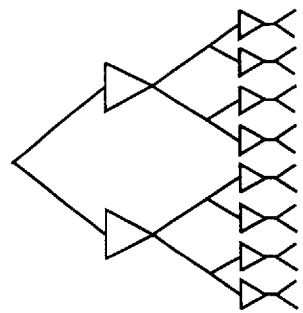
FIG. 1D is a prior art balanced tree clock distribution structure that includes buffers at branching points for reduction of clock interconnect capacitance.
Figure 2:
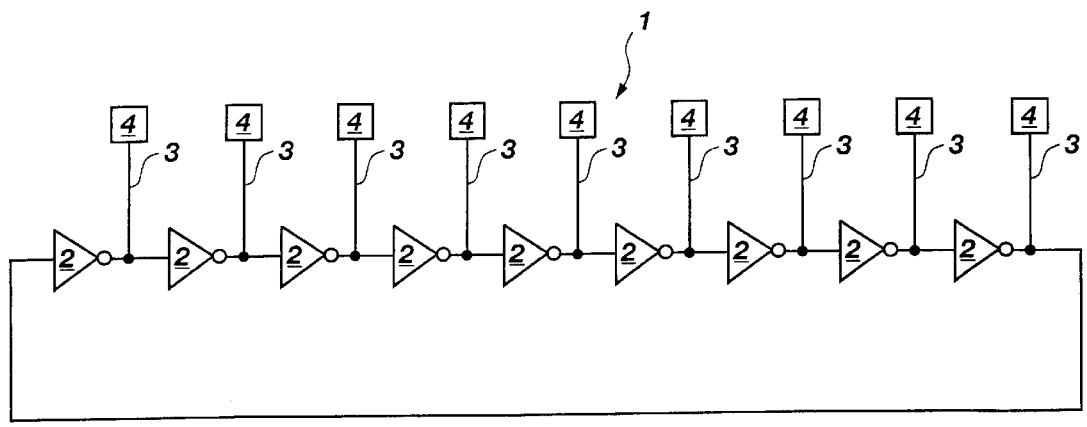
FIG. 2 is a circuit diagram of a multistage phase shift ring oscillator.

FIG. 2 depicts an example of a tapped CMOS phase shift ring oscillator 1 for generating multiple sinusoidal clock signals having different phase delays or skews. Phase shift ring oscillator 1 is made up of an odd number of amplifier stages 2. In the example of FIG. 2, nine amplifier stages 2 are used. However, a larger or smaller odd number of amplifier stages 2 could be used, as required by the particular application. A clock line 3 may be used to tap the output of each amplifier stage 2 to provide a clock signal to a clocked element 4. The phase delay of the signal carried on each clock line 3 is adjusted to compensate for the delay associated with that clock line 3 to provide for synchronous arrival of clock signals at all clocked elements 4.

Figure 3:
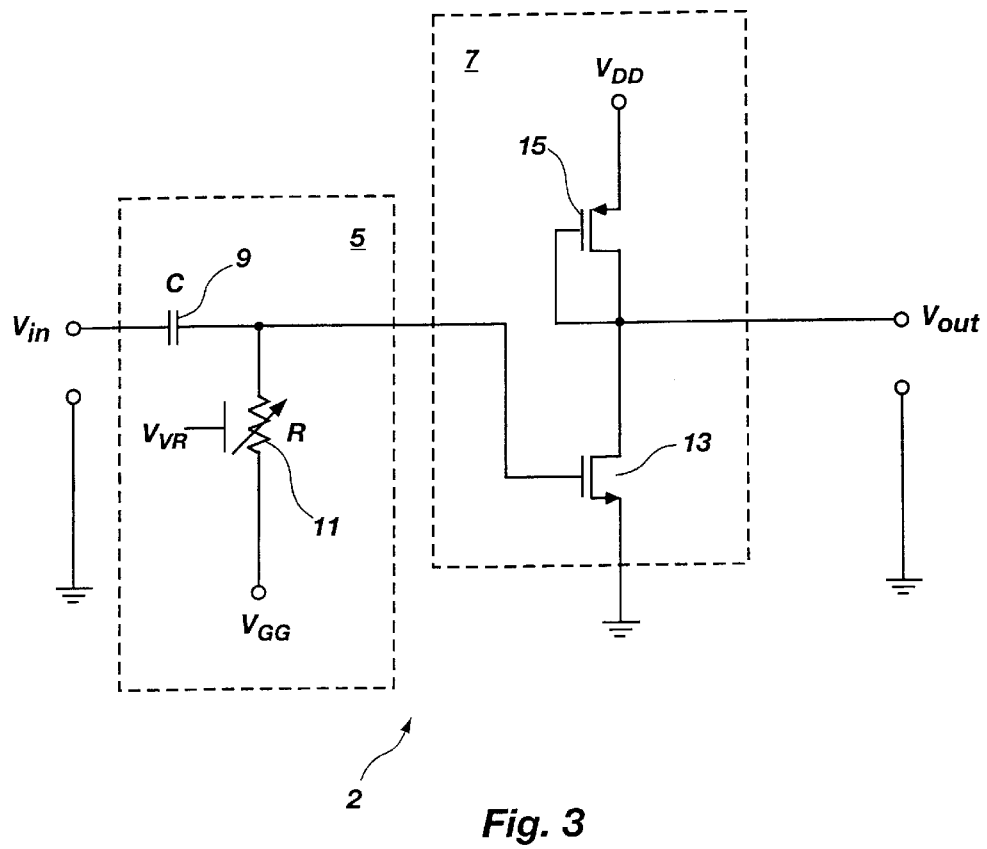
FIG. 3 is a schematic diagram of a single amplifier stage used in a phase shift ring oscillator.

As shown in FIG. 3, each amplifier stage 2 of phase shift ring oscillator 1 includes a phase shift network 5 and transistor amplifier network 7. In order to produce oscillation, the total phase shift of the series of stages must be 180 degrees, and the gain must be greater than one. By using CMOS elements in each amplifier stage 2, each amplifier stage 2 has a finite input capacitance and low gain, wide bandwidth, and low output impedance. Using an amplifier in each stage provides gain in each stage and allows a small phase shift in each stage to eventually provide a signal that is 180 degrees out of phase with the input signal. By using an odd number of amplifier stages, the phase shift in successive stages generates an unstable feedback circuit. In the inventive phase shift ring oscillator, if a larger number of stages is used, a smaller phase shift, realized at a higher frequency, is produced at each stage.

Therefore, the use of a larger number of stages results in a higher oscillation frequency. This is in contrast to conventional ring oscillators, in which the use of a larger number of stages results in a lower oscillation frequency.

Referring to FIG. 3, phase shift network 5 of amplifier stage 2 is a high pass filter RC network made up of capacitor 9 having capacitance C and a resistor having resistance R. The resistor is an NMOS transistor 11 configured as a voltage variable resistor. Input voltage $V_{in}$ is connected to a first terminal of capacitor 9. A second terminal of capacitor 9 is connected to the drain of NMOS transistor 11. The gate of NMOS transistor 11 is connected to voltage $V_{VR}$, which can be varied to adjust the value of resistance R. Gate bias supply voltage $V_{GG}$ is connected to the source of NMOS transistor 11. The gate bias supply voltage $V_{GG}$ adjusts the level of the DC gate bias current provided to the gate of NMOS transistor 13 in amplifier network 7.

Amplifier network 7 includes NMOS transistor 13 and PMOS transistor 15. PMOS transistor 15 is a diode-connected transistor, which has its gate and drain tied together. A voltage $V_{DD}$ is connected to the source of PMOS transistor 15. The value of $V_{DD}$ is selected to optimize the performance of PMOS transistor 15 and may be, for example, a few times larger than the value of $V_{GG}$. The source of NMOS transistor 13 is grounded, and the drain of NMOS transistor 13 is connected to the gate and drain of PMOS transistor 15. The output voltage $V_{out}$, which is the output of amplifier network 7 and also of amplifier stage 2, is taken from this point as well.

The frequency domain behavior of phase shift network 5 is described by the transfer function:

$$H(s) = \frac{R}{R + \frac{1}{sC}} = \frac{1}{1 + \frac{1}{sRC}}$$

where R and C are the resistance and capacitance of the phase shift network 5, as described above, and s=jω, with j being the square root of −1 and ω being the radian frequency.

The gain of the phase shift network 5 is then:

$$|H(s)| = \frac{\omega RC}{\sqrt{1 + (\omega RC)^2}}$$

and the phase angle of the phase shift network 5 is:

$$H(s) = \frac{90°}{\tan^{-1}(\omega RC)} = 90° - \tan^{-1}(\omega RC)$$

Figure 4:
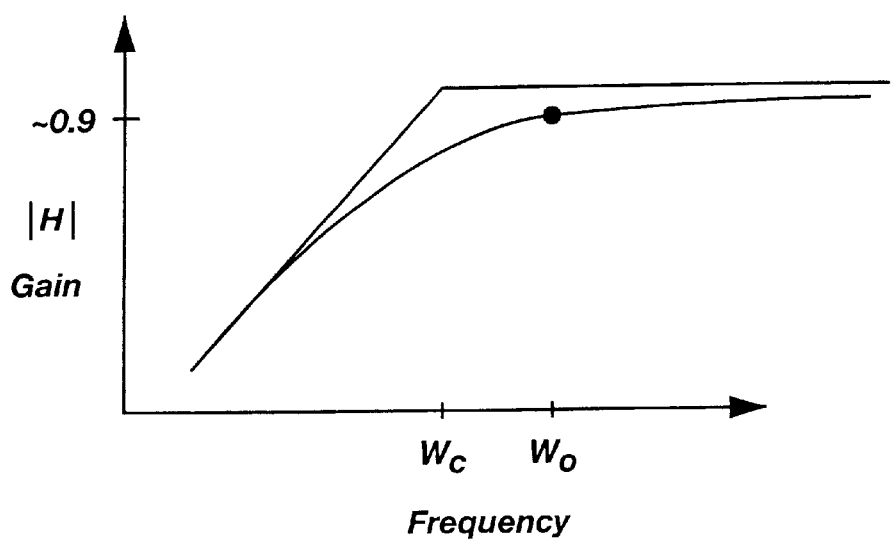
FIG. 4 shows the gain of a single amplifier stage as shown in FIG. 3 plotted as a function of oscillation frequency.

In FIG. 4, the gain of phase shift network 5 is plotted as a function of frequency ω of the signal entering the network. The corner frequency $\omega_c$ is equal to 1/RC. The oscillation frequency of the phase shift ring oscillator is indicated by $\omega_0$.

Figure 5:
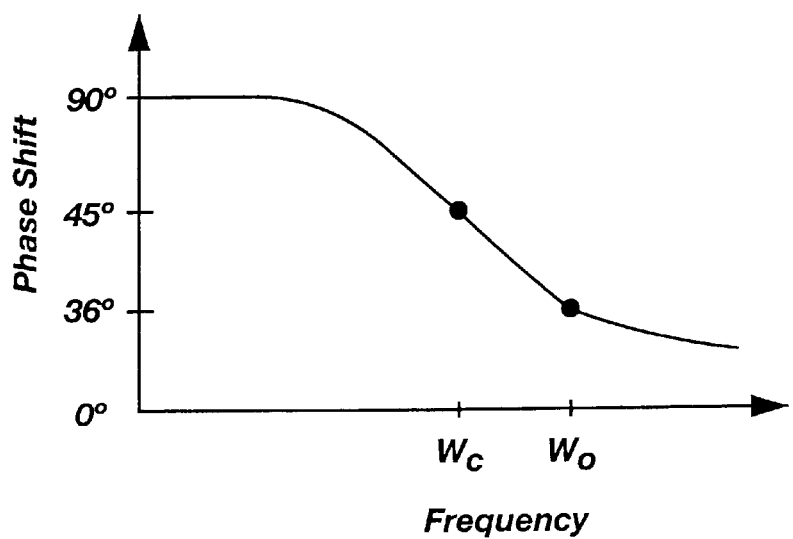
FIG. 5 shows the phase shift of a single amplifier stage as shown in FIG. 3 plotted as a function of oscillation frequency.

FIG. 5 shows the phase shift produced by phase shift network 5 as a function of frequency co of the signal entering phase shift network 5. Again, corner frequency is indicated by $\omega_c$ and is equal to 1/RC, and the oscillation frequency of the phase shift ring oscillator is indicated by $\omega_0$.

In the practice of the invention, a desirable value for $\omega_0$ is first selected, i.e., one that is suitable for use as a clock signal. R and C for each amplifier stage 2 are then selected such that phase shift network 5 has a gain of close to one at $\omega_0$. In general, the value of C is set first, and R is adjusted to produce the desired gain and phase shift. The overall frequency of oscillation $f_0$ for the phase shift ring oscillator 1 is approximately:

$$f_0 = \sum_{n=1}^{N} \frac{1}{2\pi^2 R_n C_n}$$

where N is the number of amplifier stages 2 in phase shift ring oscillator 1, and $R_n$ and $C_n$ are the resistance and capacitance, respectively, of the phase shift network of amplifier stage n.

Referring back to FIG. 3, diode connected PMOS transistor 15 can be modeled as a diode having an admittance (or conductance), looking back into the drain, of $g_d$. Diode-connected PMOS transistor 15 thus provides a load resistance $R_L$ which is equal to $1/g_d$. The admittance of NMOS transistor 13 is $g_m$ and the gain of amplifier network 7 is thus $g_m R_L$. In order for phase shift ring oscillator 1 to oscillate, it is only necessary that the gain of each amplifier stage 2 be greater than one. As noted above, phase shift network 5 is set to have a gain of just less than one, e.g., 0.9 in the example shown in FIG. 4. The overall gain of the combination of the phase shift network 5 and amplifier network 7 is thus 0.9 $g_m R_L$, so if $g_m R_L$ is slightly larger than 1.1, the overall gain of the amplifier stage will be greater than one and the condition for oscillation will be satisfied. Since $g_m$ is close to $g_d$, this condition can be met without difficulty. It should be noted that the signal entering amplifier network 7 is inverted, that is, it undergoes a 180 degree phase shift, by the transistor combination of amplifier network 7.

The resistance R of phase shift network 5 is much larger than the load resistor $R_L$ of amplifier network 7. The output impedance $Z_{out}$ of amplifier network 7, and thus also for amplifier stage 2, is simply equal to $1/g_d$. The low output impedance makes it possible to drive the phase shift network of the next stage without significant loading effects.

Phase shift ring oscillator 1, as depicted in FIG. 2, is just one example of a phase shift ring oscillator according to the present invention, which may be used for generating clock signals. Any odd number of stages can be utilized in the phase shift ring oscillator according to the invention. One clock signal may be tapped from each amplifier stage 2, but it is not required that a clock signal be tapped from each amplifier stage. Therefore, any number of clock signals up to the number of amplifier stages may be tapped from the phase shift ring oscillator. One possible application of the invention would be to produce a plurality of clock signals having different phase delays, the phase delay of each clock signal selected to compensate for the skew associate with the clock distribution line on which the clock signal is to be sent, so that all clock signals arrive at the clocked elements synchronously. By selecting an appropriate number of amplifier stages and appropriate values for the resistance and capacitance of the phase shift network of each amplifier stage, virtually any number of clock signals having any combination of phase relationship, at a desired clock frequency, can be produced. If the number of stages in phase shift ring oscillator 1 is fixed, the frequency of phase shift ring oscillator 1 can be varied by varying R in some or all of the stages. The total phase shift produced by phase shift ring oscillator 1 has to be 180 degrees, but it is not required that all stages have the same phase shift. The 180 degrees can be divided up between the amplifier stages in unequal portions.

Figure 6:
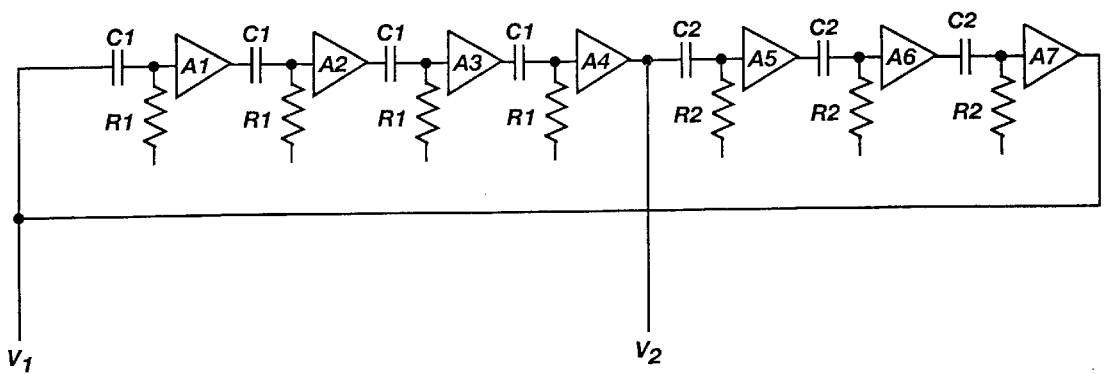
FIG. 6 shows a second embodiment of a phase shift ring oscillator according to the invention.

An exemplary phase shift ring oscillator that may be used to generate two quadrature clock signals (that is, two clock signals that are at the same frequency but have a 90 degree phase relationship) is shown in FIG. 6. The resistance and capacitance of the phase shift network of each amplifier stage is shown explicitly in FIG. 6. Four of the amplifier stages, A1, A2, A3, and A4, each have resistance R1 and capacitance C1 in the phase shift network of the amplifier stage that produce a 22.5 degree phase shift, while three of the stages, A5, A6, and A7, each have resistance R2 and capacitance C2 in the phase shift network of the amplifier stage that produce a 30 degree phase shift. The total phase shift throughout the exemplary phase shift ring oscillator is 180 degrees. A first clock signal $V_1$ is taken at the input of amplifier stage A1 and a second clock signal $V_2$, having a quadrature relationship to $V_1$, is taken at the output of amplifier stage A4.

Figure 7:
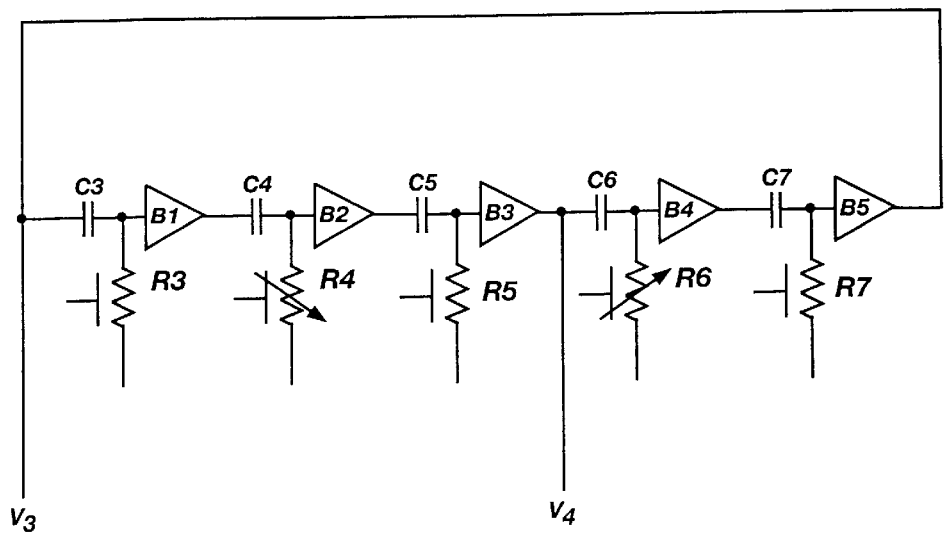
FIG. 7 shows a third embodiment of a phase shift ring oscillator according to the invention.

A further exemplary phase shift ring oscillator is shown in FIG. 7. As in FIG. 6, the resistance and capacitance for the phase shift network of each amplifier stage are shown explicitly. In this example, the phase shift ring oscillator includes five stages, B1, B2, B3, B4, and B5 with resistances R3, R4, R5, R6, and R7, and capacitances C3, C4, C5, C6, and C7. Resistances in two different stages in the ring are varied: resistance R4 in stage B2 is increased while resistance R6 in stage B4 is decreased, thereby increasing the phase shift on stage B2 and decreasing the phase shift on stage B4, but leaving the overall phase shift and oscillation frequency fixed. The phase relationship of clock signal $V_3$, taken at the input to amplifier stage B1, and clock signal $V_4$, taken at the output of amplifier stage B3, may thus be varied over a continuous range of values without altering the oscillation frequency of the phase shift ring oscillator.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A tapped phase shift ring oscillator for generating a plurality of phase shifted clock signals, comprising:
    an odd number of amplifier stages each including independent phase-shift adjustability for providing, in combination, a phase shift of 180 degrees to a received signal, each of said odd number of amplifier stages comprising a phase shift network coupled to an amplifier network, said phase shift network including a capacitor having a first terminal connected to a received input voltage and a second terminal connected to a drain of an NMOS transistor, said NMOS transistor configured as a voltage variable resistor having a resistance R; and
    at least one clock line tapped to an output of at least one of said odd number of amplifier stages for receiving a phase shifted clock signal from said at least one of said odd number of amplifier stages.

2. A tapped phase shift ring oscillator for generating a plurality of phase shifted clock signals, comprising:
    an odd number of amplifier stages each including independent phase-shift adjustability for providing, in combination, a phase shift of 180 degrees to a received signal and wherein each of said odd number of amplifier stages includes a phase shift network for phase shifting a received input voltage into a phase shifted voltage and an amplifier network for receiving and inverting said phase shifted voltage from said phase shift network to produce said phase shifted clock signal, said phase shift network comprising a capacitor having a first terminal connected to said received input voltage and a second terminal connected to a drain of an NMOS transistor, said NMOS transistor configured as a voltage variable resistor having a resistance R; and
    at least one clock line tapped to an output of at least one of said odd number of amplifier stages for receiving a phase shifted clock signal from said at least one of said odd number of amplifier stages.

3. The tapped phase shift ring oscillator of claim 2, wherein said NMOS transistor comprises:
    a drain connected to said second terminal of said capacitor;
    a gate connected to a voltage $V_{VR}$, wherein variance of said voltage $V_{VR}$ changes the resistance R of said NMOS transistor; and
    a source connected to a gate bias supply voltage $V_{GG}$.

4. A tapped phase shift ring oscillator for generating a plurality of phase shifted clock signals, comprising:
    an odd number of amplifier stages each including independent phase-shift adjustability for providing, in combination, a phase shift of 180 degrees to a received signal and wherein each of said odd number of amplifier stages includes a phase shift network for phase shifting a received input voltage into a phase shifted voltage and an amplifier network for receiving and inverting said phase shifted voltage from said phase shift network to produce said phase shifted clock signal, said amplifier network comprising:
        an NMOS transistor, comprising a gate connected to said phase shift network for receiving said phase shifted voltage, a grounded source, and a drain;
        a PMOS transistor, comprising a PMOS drain connected to a voltage $V_{DD}$, a PMOS gate connected to said drain of said NMOS transistor, and a PMOS source connected to said PMOS gate and said drain of said NMOS transistor; and
        an output voltage $V_{out}$ taken from a connection of said NMOS drain, said PMOS source and said PMOS gate as said phase shifted clock signal; and
    at least one clock line tapped to an output of at least one of said odd number of amplifier stages for receiving a phase shifted clock signal from said at least one of said odd number of amplifier stages.

5. The tapped phase shift ring oscillator of claim 4, wherein said output voltage $V_{out}$ is said output of at least one of said odd number of amplifier stages.

6. The tapped phase shift ring oscillator of claim 1, wherein each of said odd number of amplifier stages is configured to shift said received signal by an equivalent amount.

7. The tapped phase shift ring oscillator of claim 1, wherein each of said odd number of amplifier stages is configured to shift said received signal by a different amount.

8. The tapped phase shift ring oscillator of claim 1, wherein said at least one clock line tapped to an output of at least one of said odd number of amplifier stages comprises a separate clock line tapped to an output of each of said odd number of amplifier stages.

9. A tapped phase shift ring oscillator for generating a plurality of sinusoidal clock signals having different phase delays, comprising:
    an odd number of amplifier stages for providing a total phase shift of 180 degrees to a received signal, each of said odd number of amplifier stages each including independent phase-shift adjustability comprising a phase shift network for providing a gain and a phase shift to said received signal and an amplifier network for outputting a phase shifted signal, said phase shift network including a capacitor having a first terminal connected to said received signal and a second terminal connected to a voltage variable resistor; and at least one clock line tapped to an output of at least one of said odd number of amplifier stages for receiving said phase shifted signal from said at least one of said odd number of amplifier stages.

10. A tapped phase shift ring oscillator for generating a plurality of sinusoidal clock signals having different phase delays, comprising:

an odd number of amplifier stages for providing a total phase shift of 180 degrees to a received signal, each of said odd number of amplifier stages each including independent phase-shift adjustability comprising a phase shift network for providing a gain and a phase shift to said received signal and an amplifier network for outputting a phase shifted signal; and at least one clock line tapped to an output of at least one of said odd number of amplifier stages for receiving said phase shifted signal from said at least one of said odd number of amplifier stages, a frequency domain of said phase shift network represented by a transfer function:

$$H(s) = \frac{R}{R + \frac{1}{sC}} = \frac{1}{1 + \frac{1}{sRC}}$$

wherein R is a the resistance of said phase shift network, C is a capacitance of said phase shift network, $s=j\omega$, $j$ is a square root of $-1$, and $\omega$ is a radian frequency.

11. A tapped phase shift ring oscillator for generating a plurality of sinusoidal clock signals having different phase delays, comprising:

an odd number of amplifier stages for providing a total phase shift of 180 degrees to a received signal, each of said odd number of amplifier stages each including independent phase-shift adjustability comprising a phase shift network for providing a gain and a phase shift to said received signal and an amplifier network for outputting a phase shifted signal; and at least one clock line tapped to an output of at least one of said odd number of amplifier stages for receiving said phase shifted signal from said at least one of said odd number of amplifier stages, said gain of said phase shift network represented by a function:

$$|H(s)| = \frac{\omega RC}{\sqrt{1 + (\omega RC)^2}}$$

wherein R is a resistance of said phase shift network, C is a capacitance of said phase shift network, and $\omega$ is a radian frequency.

12. A tapped phase shift ring oscillator for generating a plurality of sinusoidal clock signals having different phase delays, comprising:

an odd number of amplifier stages for providing a total phase shift of 180 degrees to a received signal, each of said odd number of amplifier stages each including independent phase-shift adjustability comprising a phase shift network for providing a gain and a phase shift to said received signal and an amplifier network for outputting a phase shifted signal; and at least one clock line tapped to an output of at least one of said odd number of amplifier stages for receiving said phase shifted signal from said at least one of said odd number of amplifier stages, said phase shift corresponds to a phase angle represented by a function:

$$H(s) = \frac{90°}{\tan^{-1}(\omega RC)} = 90° - \tan^{-1}(\omega RC)$$

wherein R is a resistance of said phase shift network, C is a capacitance of said phase shift network, and $\omega$ is a radian frequency.

13. The tapped phase shift ring oscillator of claim 9, wherein each of said odd number of amplifier stages is configured to shift said received signal by an equivalent amount.

14. The tapped phase shift ring oscillator of claim 9, wherein each of said odd number of amplifier stages is configured to shift said received signal by a different amount.

15. The tapped phase shift ring oscillator of claim 9, wherein said at least one clock line tapped to an output of at least one of said odd number of amplifier stages comprises a separate clock line tapped to an output of each of said odd number of amplifier stages.

16. A method of producing a plurality of skewed clock signals from a single clock signal, comprising:

introducing said single clock signal to a phase shift ring oscillator comprising an odd number of amplifier stages each including a phase shift network for independent phase-shift adjustability for shifting a phase of said single clock signal a total of 180 degrees, said phase shift network each including a capacitor having a first terminal connected to an input and a second terminal connected to a drain of an NMOS transistor, the NMOS transistor configured as a voltage variable resistor;

shifting the phase of said single clock signal in each of said odd number of amplifier stages by a predetermined amount; and tapping an output of at least one of said odd number of amplifier stages for receiving a skewed clock signal.

17. The method of claim 16, further comprising tapping an output of each of said odd number of amplifier stages.

18. The method of claim 16, further comprising tapping a plurality of outputs of said odd number of amplifier stages to produce a plurality of clock signals having different phase shifts.

19. The method of claim 16, further comprising:

tapping a first output of one of said odd number of amplifier stages to receive a first skewed clock signal; and tapping a second output of another one of said odd number of amplifier stages to receive a second skewed clock signal, said second skewed clock signal shifted 90 degrees from said first skewed clock signal.

20. A method of producing a plurality of skewed clock signals from an original clock signal, comprising:

introducing said original clock signal to an input of a first amplifier of a phase shift ring oscillator to produce a first shifted clock signal at an output of said first amplifier, said first amplifier including a first phase shift network for independent adjustability of said first shifted clock signal;

tapping said output of said first amplifier to obtain said first shifted clock signal;

introducing said output of said first amplifier to an input of a second amplifier of said phase shift ring oscillator to produce a second shifted clock signal at an output of said second amplifier, said second amplifier including a second phase shift network for independent adjustability of said second shifted clock signal from said first shifted clock signal;

tapping said output of said second amplifier to obtain said second shifted clock signal;

introducing said output of said second amplifier to an odd number of amplifiers of said phase shift ring oscillator to produce a shifted clock signal at an output of each of said odd number of amplifiers, said odd number of amplifiers each including an odd number of phase shift networks for independent adjustability of said shifted clock signal at said output of each of said odd number of amplifiers, said first, second and shifted clock signals at said output of each of said odd number of amplifiers totaling 180 degrees, said first, second and odd number of phase shift networks each including a capacitor having a first terminal connected to said input and a second terminal connected to a drain of an NMOS transistor, the NMOS transistor configured as a voltage variable resistor; and tapping said output of each of said odd number of amplifiers to obtain an odd number of said shifted clock signals.

21. A method of producing a plurality of skewed clock signals from a single clock signal, comprising:

introducing said single clock signal to a phase shift ring oscillator comprising an odd number of amplifiers connected in series, each of said odd number of amplifiers having an input and an output and each including independent phase-shift adjustability;

shifting a phase of said single clock signal according to a phase shift network in each of said odd number of amplifiers to shift said single clock signal a total of 180 degrees, each phase shift network including a capacitor having a first terminal connected to said input and a second terminal connected to a drain of an NMOS transistor, the NMOS transistor configured as a voltage variable resistor; and tapping at least one output of said odd number of amplifiers for producing a skewed clock signal.

22. A method of producing a plurality of skewed clock signals from a single clock signal, comprising:

introducing said single clock signal to a phase shift ring oscillator comprising an odd number of amplifiers connected in series, each of said odd number of amplifiers having an input and an output and each including independent phase-shift adjustability;

within each of said odd number of amplifiers, introducing a signal to said input of one of said odd number of amplifiers comprising a phase shift network and an amplifier network;

shifting a phase of said signal to produce a phase shifted signal in said phase shift network and shifting the phase of said signal in said phase shift network comprises:

providing a capacitor having a first terminal for receiving said signal and a second terminal connected to a drain of an NMOS transistor configured as a voltage variable resistor; and controlling a voltage applied to a gate of said NMOS transistor to adjust a resistance of said NMOS transistor and controlling a supply voltage applied to a source of said NMOS transistor to adjust a shift of the phase of said signal;

inverting said phase shifted signal in said amplifier network; and outputting said phase shifted signal from said output of said amplifier network;

shifting a phase of said single clock signal in each of said odd number of amplifiers to shift said single clock signal a total of 180 degrees; and tapping at least one output of said odd number of amplifiers for producing a skewed clock signal.

23. A method of providing a plurality of skewed clock signals synchronously to a plurality of clocked elements, comprising:

introducing a clock signal to an odd number of amplifiers in a phase shift ring oscillator, each of said amplifiers including a phase shift network for independent phase-shift adjustability, said phase shift network including a capacitor having a first terminal connected to said input and a second terminal connected to a drain of an NMOS transistor, the NMOS transistor configured as a voltage variable resistor;

shifting a phase of said clock signal in each of said odd number of amplifiers such that a total phase shift of said clock signal in said phase shift ring oscillator is 180 degrees;

tapping into an output of each of a plurality of said odd number of amplifiers for receiving a different phase shifted clock signal from each of said tapped outputs;

sending said different phase shifted clock signals to said plurality of clocked elements such that each of said different phase shifted clock signals arrives at said plurality of clocked elements in synchronization.

* * * * *

UNITED STATES PATENT AND TRADEMARK OFFICE
CERTIFICATE OF CORRECTION

PATENT NO.    : 6,737,926 B2                                   Page 1 of 1
DATED         : May 18, 2004
INVENTOR(S)   : Leonard Forbes It is certified that error appears in the above-identified patent and that said Letters Patent is hereby corrected as shown below:

Column 5,
Line 58, change "co" to -- ω --

Column 6,
Line 50, change "associate" to -- associated --

Column 12,
Line 37, before "input" change "said" to -- an --

Signed and Sealed this

First Day of February, 2005

JON W. DUDAS
*Director of the United States Patent and Trademark Office*